United States Patent [19]

Yamaga et al.

[11] Patent Number: 5,221,201
[45] Date of Patent: Jun. 22, 1993

[54] VERTICAL HEAT TREATMENT APPARATUS

[75] Inventors: Kenichi Yamaga; Katsutoshi Ishii, both of Sagamihara; Naotaka Ogino, Shiroyama, all of Japan

[73] Assignee: Tokyo Electron Sagami Limited, Kanagawa, Japan

[21] Appl. No.: 734,784

[22] Filed: Jul. 23, 1991

[30] Foreign Application Priority Data

Jul. 27, 1990 [JP] Japan .................................. 2-200439
Jul. 27, 1990 [JP] Japan .................................. 2-200440

[51] Int. Cl.$^5$ ............................................. F27D 3/12
[52] U.S. Cl. ........................................ 432/241; 432/6; 432/11; 432/152; 432/253
[58] Field of Search ................... 432/241, 152, 5, 6, 432/11, 253

[56] References Cited

U.S. PATENT DOCUMENTS

| | | | |
|---|---|---|---|
| 4,610,628 | 9/1986 | Mizushina | 432/253 |
| 4,722,683 | 2/1988 | Royer | 432/152 |
| 4,778,382 | 10/1988 | Sakashida | 432/152 |
| 4,976,613 | 12/1990 | Watanabe | 432/253 |
| 5,000,682 | 3/1991 | Heidt et al. | 432/241 |
| 5,102,331 | 4/1992 | Brekke et al. | 432/152 |

FOREIGN PATENT DOCUMENTS

| | | |
|---|---|---|
| 61-11524 | 5/1986 | Japan . |
| 62-8633 | 1/1987 | Japan . |
| 62-36817 | 2/1987 | Japan . |
| 62-146265 | 6/1987 | Japan . |
| 64-26833 | 2/1989 | Japan . |

*Primary Examiner*—A. Michael Chambers
*Attorney, Agent, or Firm*—Oblon, Spivak, McClelland, Maier & Neustadt

[57] ABSTRACT

A vertical heat treatment apparatus includes a casing, a vertical heat treatment furnace provided in the casing, a substrate holding unit mounted in the casing for holding substrates to be heat-treated in the vertical heat treatment furnace, a loading/unloading unit having a wafer boat for supporting the substrates, the loading/unloading unit being adapted to put the substrates in and take the same out of the vertical heat treatment furnace, and a transportation robot for moving the substrates between the substrate holding unit and the wafer boat. The vertical heat treatment apparatus further includes a clean air supplying unit for supplying clean air sideways to the wafers supported by the wafer boat when the loading/unloading unit is at an unloading position, a and duct for introducing air from the outside of the apparatus. The clean air supplying unit is provided with an air filter disposed opposed to the wafer boat. Air in a clean room whose pressure is set to be higher than the pressure in the casing is introduced into the clean air supplying unit through the duct.

17 Claims, 4 Drawing Sheets

VERTICAL HEAT TREATMENT APPARATUS

BACKGROUND OF THE INVENTION

1. Field of the Invention

This invention relates to a vertical heat treatment apparatus used for manufacturing semiconductors.

2. Description of the Related Art

As a higher density has been required for semiconductor elements, more accurate heat treatment has come to be required for semiconductor devices. Wafers heat-treated in a reaction vessel in a heat treatment furnace such as a vertical or horizontal furnace is unloaded outside of a heat treatment path. When the reaction tube is uncovered soon after the heat treatment has been carried out, convention occurs in the reaction tube due to the temperature difference between the interior of the reaction tube and the outside thereof. It is necessary to keep the wafer atmosphere at a high temperature clean in order to increase the yield of wafers which are heat-treated accurately.

Japanese Laid-open Patent Application Publications No. 61-111524 and No. 62-146265 and Japanese Laid-open Utility Model Publication No. 62-8633 disclose apparatuses for making clean air flow sidewise onto wafers unloaded from a vertical heat treatment furnace. Japanese Laid-open Patent Application Publication No. 62-36817 discloses an apparatus for making air flow downward onto wafers unloaded from a horizontal heat treatment furnace. Further, Japanese laid-open Utility Model Application No. 64-26833 discloses an apparatus for making air side-flow at the unloading position of a horizontal heat treatment furnace.

In those conventional apparatuses, air supplied by a motor fan or the like is cleaned by passing through a filter and is made to flow onto wafers.

The following must be considered when clean air is supplied to the unloading position by means of a fan. When air to be supplied is circulated in a room, the temperature in the room is raised. In order to avoid this, air must be introduced into the room from another room by means of a fan. Since the unloading position is provided in a so-called maintenance room, pressure difference is provided between the maintenance room and the surrounding clean room such that the pressure in the clean room is positive. When, therefore, air in the utility zone is introduced into the clean room by the fan, an excessive load is exerted on the fan due to the pressure difference. Because the pressure difference is varied according to user's preference, the amount of air sent by a fan having the same blowing capacity changes and air cannot be sent in some cases.

SUMMARY OF THE INVENTION

The object of this invention is to provide a vertical heat treatment apparatus in which loads exerted on a fan are reduced by improving a duct for supplying air to the fan such that air is kept clean at an unloading position.

The object of this invention is attained by a vertical heat treatment apparatus which comprises a casing provided with a vertical treatment furnace, substrate holding means also housed in the casing for holding substrates to be heat-treated in the vertical heat-treatment furnace, substrate supporting means for supporting substrates, loading/unloading means for putting the substrate in and taking the same out of the vertical heat treatment furnace, transmitting means for transporting the substrates between the substrate holding means and the substrate supporting means, clean air supplying means for sideways supplying clean air to the substrates supported by the substrate supporting means when the loading/unloading means is at an unloading position, the clean air supplying means being provided with an air filter disposed opposed to the substrate supporting means, and a duct for conducting air into a clean room at a pressure higher than that in the casing into the clean air supplying means.

In this invention, air is introduced from the clean room, whose pressure is set at a value higher (that is, a positive pressure) than the pressure at the unloading position in the casing, into the casing via the duct and the air filter. This arrangement easily allows air to flow from the clean room at a higher pressure into the casing at a lower pressure. Clean air flows sidewise onto the substrates disposed at the unloading position such that excessive loads are not applied to the blower fan. When a vertical heat treatment apparatus is used, the air conducting duct can be set in the bottom portion of the casing in which various devices are housed, and thus the duct can be provided without increasing the setting space.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

This invention will be explained with reference to preferred embodiments with reference to the accompanying drawings.

Figure 1:
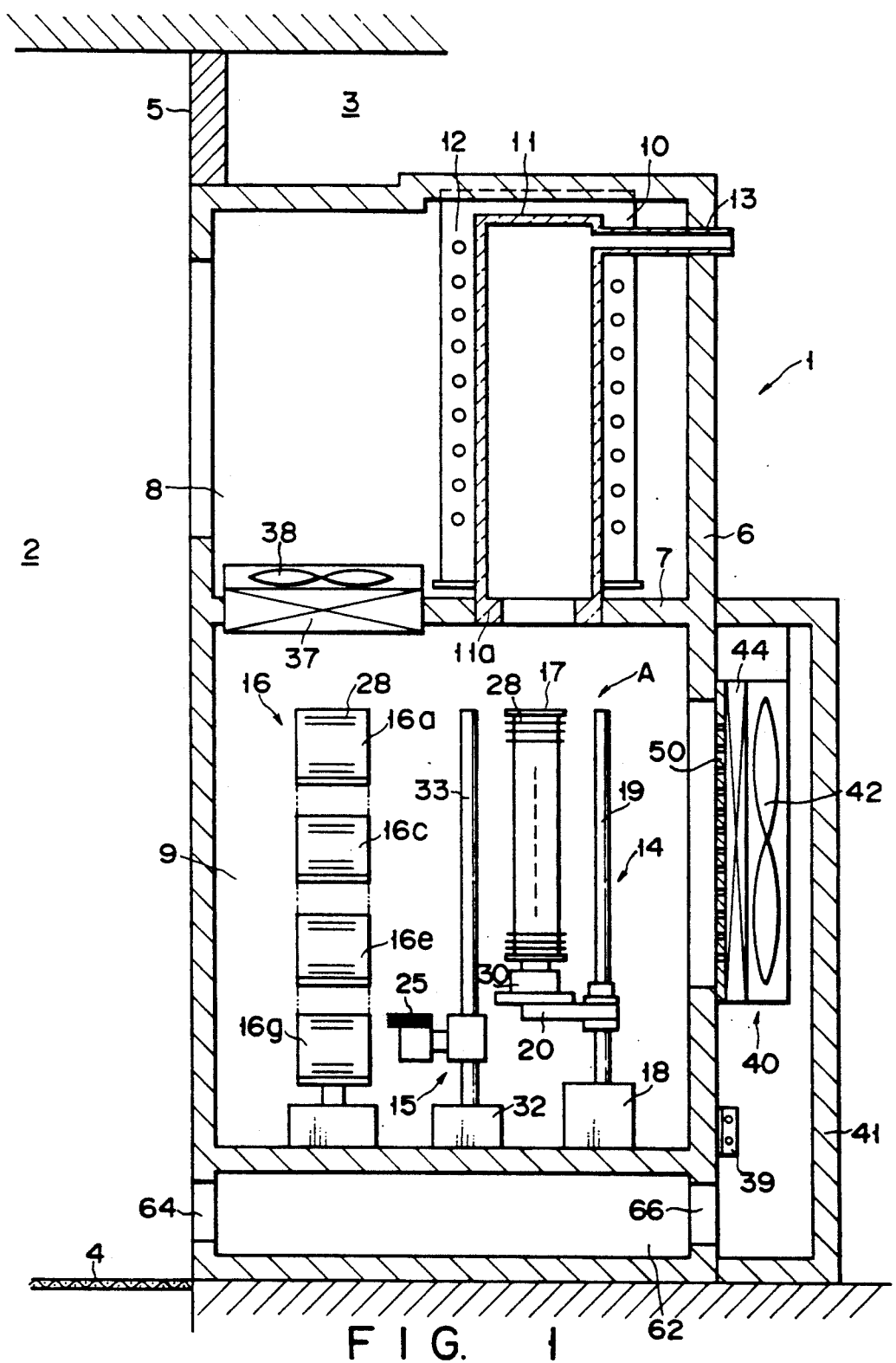
FIG. 1 is a lateral view, with part thereof cross-sectioned, of an embodiment of a vertical heat treatment apparatus according to this invention.

As shown in FIG. 1, a vertical heat treatment apparatus 1 is installed in a utility zone 3 disposed adjacent a clean room 2 for manufacturing semiconductors. In general, the floor of the clean room 2 is formed with a net 4 for passing dust or the like. Air communication between the clean room 2 and the utility zone 3 is interrupted by a vertical partition wall 5. The front portion of the vertical heat treatment apparatus 1 communicates with the clean room 2 through an opening formed in the partition wall 5.

Referring to FIG. 1 again, the vertical heat treatment apparatus 1 has a casing 6, the interior of which is divided by a partition plate 7 into a loading room 8 and an unloading room 9, and a heat treatment furnace 10 is mounted in the loading room 8.

In the heat treatment furnace 10 is provided a reaction tube 11 made of material such as quartz glass on which a heat treatment gas is hard to react and which shows high heat resistance. Wound around the reaction tube 11 is a coiled heater 12 for heating the interior of the reaction tube 11 to a required temperature, for example, which is selected among 600° to 1,200° C., in a spaced relation from the tube 11 at a predetermined distance so that the heater 12 is not in contact with the tube 11. The reaction tube 11 is connected to a gas source by means of a gas supplying pipe (not shown). On the upper portion of the reaction tube 11 is connected an air exhaust pipe 13 which is connected to a vacuum pump (not shown) which reduces the pressure in the reaction tube 11 to a predetermined level and exhausts a heat treatment gas.

In the unloading room 9 are provided a boat elevator 14, a transportation robot 15 and a cassette holding unit 16.

The boat elevator 14 comprises a wafer boat 17 which receives as many number of substrates (for example, 100 to 150 semiconductor wafers 28) as can be heat-treated in the reaction tube 11 at a time so as to be arranged vertically at a required space, and a lift mechanism 18 for transporting the wafer boat 17 into and from the reaction tube 11. The lift mechanism 18 is provided with a guide rod 19 extending vertically and a motor (not shown) for vertically moving a first arm 20 slidably mounted on the guide rod 19. A second arm 21 is rotatably mounted on the forward portion of the first arm 20. Operations such as positioning, setting the timing or the like for transporting the wafer are automatically performed in accordance with prememorized programs.

Figure 2:
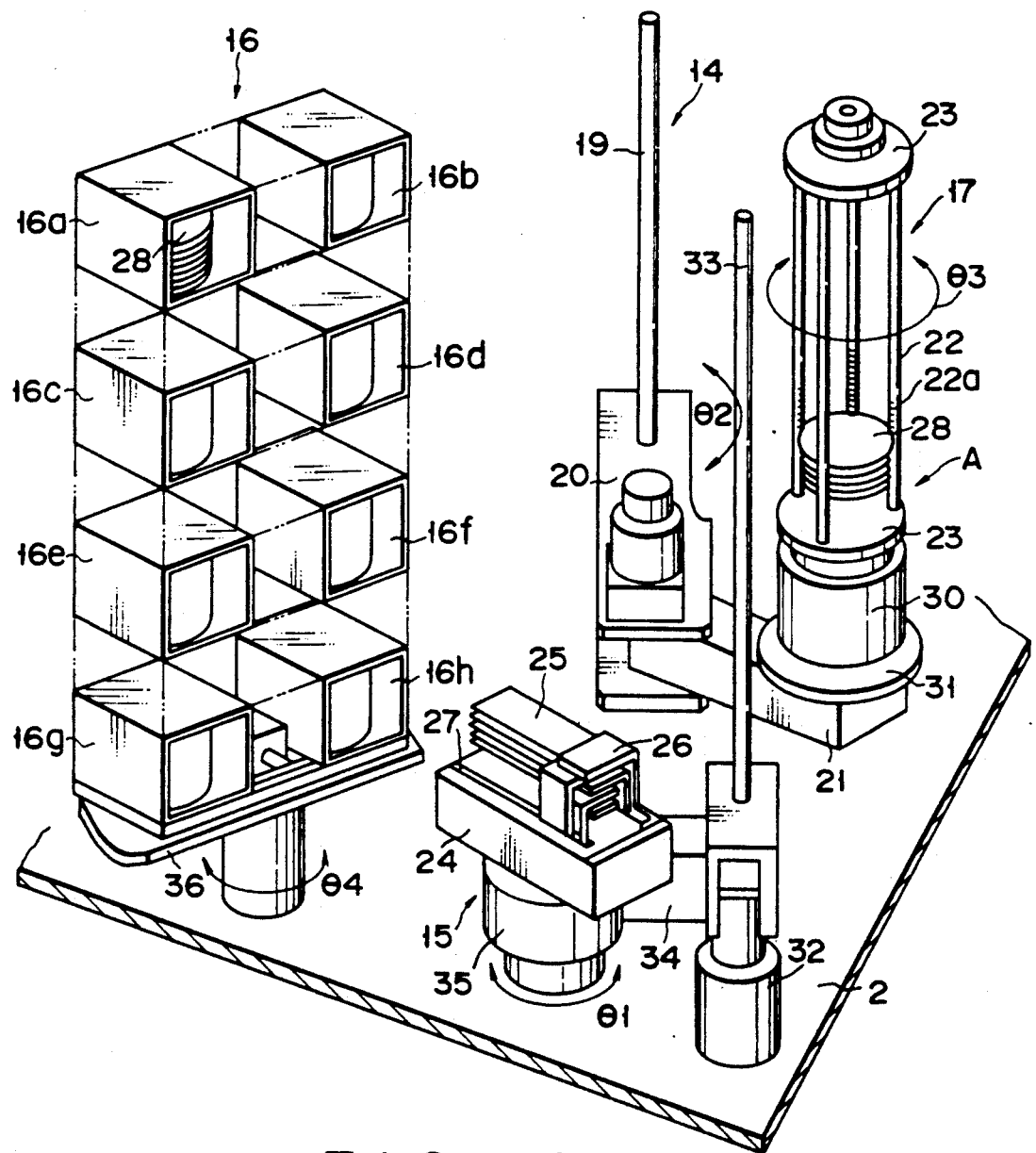
FIG. 2 is a perspective view showing the structure of an unloading room of the vertical heat treatment apparatus.

Referring to FIGS. 1 and 2, a heat insulating tube or heat keeping tube 30 is provided on the lower end of the wafer boat 17. On the lower end of the heat insulating tube 30 for keeping the temperature of the wafers 28 to a predetermined value is formed a flange 31 which contacts the lower surface of the opening 11a of the reaction tube 11 and seals the same when the wafer boat 17 is lifted. The flange 31 is disposed on the forward portion of the second arm 21. The wafer boat 17 comprises four supporting members 22 made of heat-resisitive and corrosion-resistive material such as quartz glass and fixing members 23 for fixing them together. Each of the supporting members 22 is formed with a plurality of grooves 22a engaging the wafers 28 to receive them. The wafers 28 are loaded in the heat treatment furnace 10 from its bottom by means of the boat elevator 14, heat-treated by means of such as a CVD film forming process and unloaded to a position (an unloaded position) shown at A. The boat elevator 14 includes a motor (not shown) for rotating the first arm 20 in the directions shown by an arrow $\theta_2$ (FIG. 2) and a motor (not shown) for rotating the wafer boat 17 in the directions depicted by an arrow $\theta_3$ (FIG. 2).

As shown in FIG. 2, the transportation robot 15 has a drive block 24 having five wafer supporting arms 25 arranged in parallel to each other at intervals each corresponding to the thickness of a wafer 28. The distal end of each arm 25 is fixed to the corresponding one of sliders 26 provided on the drive block 24. Each slider 26 engages longitudinally extending slide grooves 27 formed in the drive block 24 so as to be slidable back and forth along the slide grooves 27. A driving mechanism (not shown) for reciprocating the sliders 26 in the lengthwise directions is housed in the drive block 24 such that one of the supporting arms 25 can be reciprocated or all of them can be moved back and forth simultaneously.

The transportation robot 15 is provided with a lift mechanism 32 which has a guide rod 33 extending vertically and a motor (not shown) for moving an arm 34 slidably mounted on the lift mechanism 32 vertically along the guide rod 33. On the forward end of the arm 34 is provided a rotary drive mechanism 35 for rotating the drive block 24 mounted thereon through 200° or more in the directions shown by an arrow $\theta_1$.

The cassette holding unit 16 includes a cassette loader 36 on which are loaded eight wafer cassettes 16a to 16h, each cassette capable of receiving a plurality of (for example, twenty-five) semiconductor wafers 28. The wafer loader 36 is rotated by means of a motor (not shown) in either direction shown by an arrow $\theta_4$. With this arrangement, therefore, the wafer cassette holder unit 16 is rotated in a direction shown by $\theta_4$ such that the wafer cassettes 16a to 16h are directed toward the transportation robot 15 and then the supporting arms 25 are moved forward or rearward, thereby taking out wafers 28 from the wafer cassettes or moving the wafers 28 to the wafer boat 17.

A structure for keeping clean the atmosphere of the unloading room 9 of the casing 6 will now be explained.

As shown in FIG. 1, a filter unit 37 and a fan 38 are provided in a partition wall 7 of the casing 6 over the wafer cassette holding unit 16 such that the loading room 8 communicates with the unloading room 9 through the unit 37 and the fan 38. The fan 38 supplies clean air to the unloading room 9 at an air flow rate of 9.9 m³/min, for example. Heated exhaust air in the unloading room 9 is sent out through the air exhaust pipe 13 at an air flow rate of 2 m³/min, for example. A HEPA filter, an ULPA filter or the like is used as the filter unit 37. Clean air filtered by the filter unit 37 is supplied onto the wafers 28 in the process of the transportation of them so as to prevent dust from being attached to the wafers 28.

A structure for keeping clean the atmosphere in the vicinity of the unloading position A under the heat treatment furnace 10 will now be explained.

An openable back door 41 is hinged by means of a hinge 39 to the lower portion of the lateral side of the casing 6 at which the rear wall of the boat elevator 14 is disposed. The maintenance of the unloading room 9 of the casing 6 can be carried out by opening the back door 41. The back door 41 is made hollow so as to open to the unloading room 9. At a position opposed to the unloading position A in the hollow portion of the back door 41 is provided a clean module 40 which comprises a fan 42 for delivering clean air, a filter 44 and a heat reflector or a heat reflecting plate 50.

The filter 44 is, for example, a HEPA filter made of electrostatically shielded resin and is used for cleaning air delivered by the fan 42. The air flow capacity of the clean module 40 is 1.1 m³/min, for example, and the air flow speed at the filter 44 can be adjusted to 0.1 to 1.0 m/sec, for example. In this embodiment, the distance between the front face of the module 40 and the ends, opposed thereto, of the unloaded wafers 28 is set to 150 mm and the air flow speed at the filter 44 is adjusted to 0.3 m/sec.

The heat reflector 50, which has a function to reflect, on its surface, heat rays such as infrared rays or the like, reflects radiant heat from the wafers 28 soon after they are loaded on the wafer boat 17 and prevents the temperature rise of the filter 44. Three embodiments of the heat reflectors 50 are shown in FIGS. 3 to 5.

Figure 3:
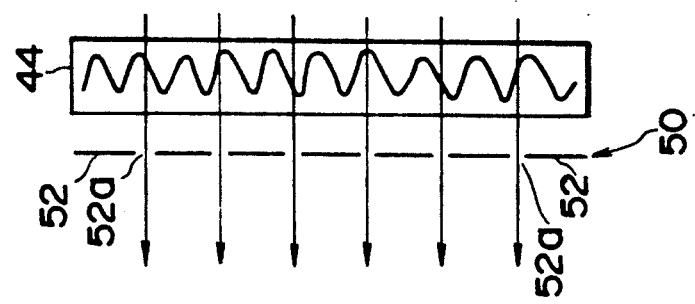
FIG. 3 is a schematic view of a first embodiment of a clean module according to this invention.

The heat reflector 50 shown in FIG. 3 comprises a punched metal plate (heat reflecting plate) 52 made of stainless steel (SUS) and punched with a plurality of air through holes 52a.

Figure 4:
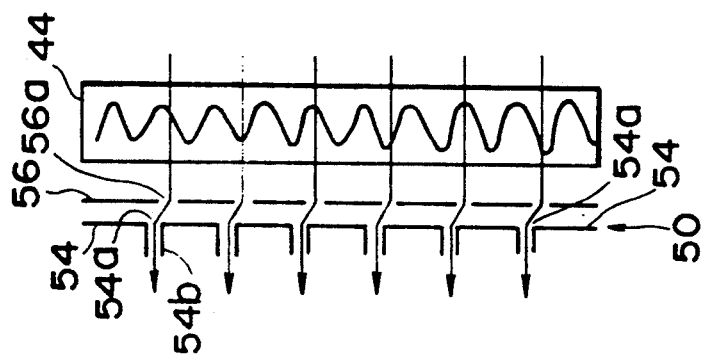
FIG. 4 is a schematic view of a second embodiment of a clean module according to this invention.

The heat reflector 50 shown in FIG. 4 comprises a first punched metal plate (heat reflecting plate) 54 made of stainless steel (SUS) and a second punched metal plate 56 provided in parallel to the first punched metal plate 54. Both plates 54 and 56 are formed with punched air through holes 54a and 56a displaced vertically from each other. From the surface of the first punched metal 54 extend hoods 54b for supplying air onto the wafers 28 in a laminated and side-flow state.

Figure 5:
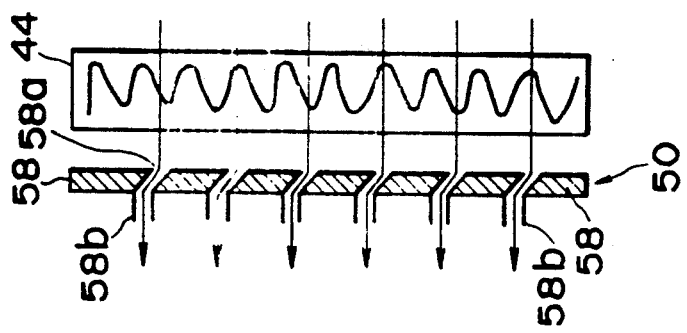
FIG. 5 is a schematic view of a third embodiment of a clean module according to this invention.

The heat reflector 50 as shown in FIG. 5 comprises a single thick metal plate (heat reflecting plate) 58. It has a plurality of air holes 58a penetrating therethrough from its rear surface at the side of the filter 44 to its front surface. From the front surface of the plate 58 extend a plurality of hoods 58b communicating with the front openings of the air holes 58a.

The shape of the surface of the heat reflecting plate is not limited to a plane defined by a plate as described above, but may take any shape so long as it can exhibit a proper heat reflecting characteristic. The heat reflecting plate may be made of aluminum (Al).

Air is introduced into the hollow portion of the back door 41 from the clean room 2 in which the degree of the clean state of air is maintained to about class 10. In order to do so, a horizontal duct 62 is provided in the bottom portion of the casing 6 or under the casing 6. The duct 62 has an opening 64 communicating with the clean room 2 and another opening 66 communicating with the hollow portion of the back door 41. A pre-filter (not shown) can be provided at the opening 66.

In general, the pressure in the clean room 2 is made higher than the pressure in the utility zone 3 (that is, the pressure in the clean room 2 is set to a positive pressure with respect to the pressure in the utility zone 3) such that air in the clean room 2 smoothly flows in the back door 41 through the duct 62. An opening (not shown) may be formed in the lowest partition wall of the casing 6 so as to effect communication between the casing 6 and the duct 62, and a further opening (not shown) may be formed in the partition wall of the casing 6 between the casing 6 and the clean room 2 for communicating therebetween.

The operation of the heat treatment apparatus of the first embodiment of this invention will now be explained.

Five semiconductor wafers 28 are taken out of one of the wafer cassettes 16a to 16h in the cassette holding unit 16 by means of the five supporting arms 25 of the transportation robot 15 and moved onto the wafer boat 17. A test wafer or a dummy wafer can be moved onto the wafer boat 17 by using one of the supporting arms 25. The transportation of the wafers 28 are repeated until a required number of the wafers 28 are loaded on the wafer boat 17. Thereafter, the heat insulating tube 30 and the wafer boat 17 are moved into the reaction tube 11 of the heat treatment furnace 10 and the wafers 28 are heat-treated by using a CVD film formation process.

After the heat treatment has been completed in the reaction tube 11, the boat elevator 14 is lowered and the heat insulating tube 30 and the wafer boat 17 is unloaded at the unloading position A. Since the temperature of the wafers 28 and the boat 17 is very high just after the heat treatment, dust is attached to the wafers 28 and the yield is reduced unless the atmosphere at the unloading position A is not clean.

In this embodiment, however, clean air flow sidewise onto the wafers at the position disposed opposite to the unloading position A, whereby the atmosphere at the unloading position A can be kept clean. Air flows sidewise from the clean room 2 disposed adjacent the casing 6. Since the pressure in the clean room 2 is made higher than the pressure in the casing 6, air is smoothly conducted in the back door 41 through the duct 62 and can be circulated smoothly without exerting excessive loads on the fan 42 in the clean module 40. The air which has flowed in the door 41 blows out through the filter 44 by means of the fan 42 and is rendered to make air flow sidewise onto the wafers 28 disposed at the unloading position A.

In this embodiment, the clean module 40 is disposed close to the unloaded wafers 28 at the position separated by, for example, 150 mm from them. Radiant heat from the wafers 28 or the boat 17 heated to high temperature is effectively reflected by the heat reflector 50 disposed in front of the filter 44, preventing the rise of the temperature of the filter 44. The air through holes 52a formed in the heat reflector 50 as shown in FIG. 3 enables the clean air blown out through the filter 44 to arrive at the wafers 28 in a state in which a laminated flow is retained.

Since the air through holes 52a in the heat reflector 50 as shown in FIG. 3, are directed toward the filter 44, their central lines are perpendicular to the filter 44. Heat rays such as infrared rays pass through the air holes 52a, and thus the heat rays are not reflected at the holes 52a. On the contrary, the air through holes 54a and 56a in the heat reflector 50 as shown in FIG. 4 are not aligned with each other and the central lines of the air through holes 58a of the heat reflector 50 as shown in FIG. 5 are inclined with respect to the filter 44. The heat rays emitted from the unloaded wafers 28 do not pass through the holes 56a and 58a, and consequently are reflected at the second plate 56 and the inner wall of the hole 58a, assuring of the reflection of the radiant heat from the unloaded wafers 28. In both cases, it is preferred that the hoods 54b and 58b are added in order to ensure the side flow of air in a laminated state.

Since the clean module 40 is housed in the back door 41, the apparatus according to this invention can be made smaller in depth and thus has a smaller floor space than the conventional apparatus.

Figure 6:
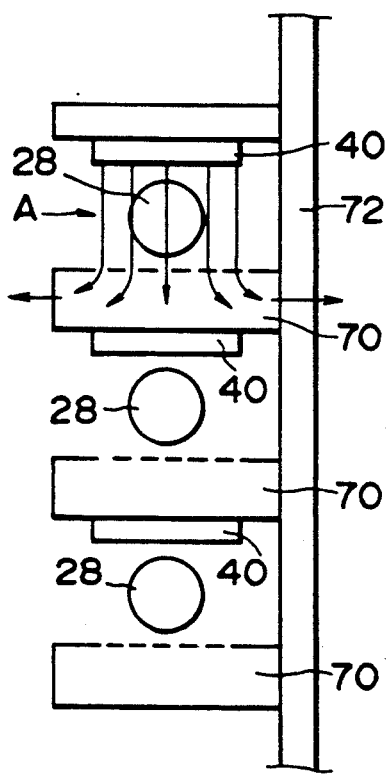
FIG. 6 is a side view of a first embodiment of a horizontal multi-stage type furnace to which the clean modules according to this invention are applied.
Figure 7:
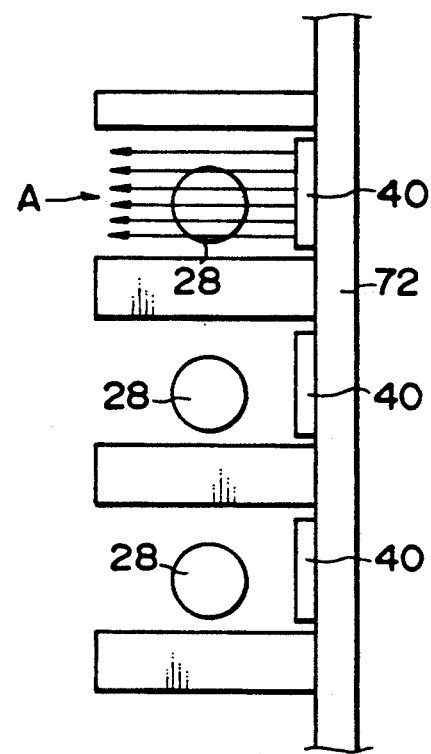
FIG. 7 is a side view of a second embodiment of a horizontal multi-stage type furnace to which the clean modules according to this invention are applied.

In FIGS. 6 and 7 illustrate horizontal multi-stage type furnaces provided with the clean modules 40 according to this invention.

FIG. 6 shows a horizontal furnace in which air is made to flow downward at the unloading positions A of the wafers 28. Over each unloading position A in each stage of the furnace is disposed a clean module 40 provided with a fan (not shown) and comprising a filter 44 and a heat reflector 50 as shown in either one of FIGS. 3 to 5. Under each clean module 40, an exhaust module 70 is provided.

As seen from FIG. 6, the stages of the horizontal multi-stage furnace are independently constructed from one another. Since each clean module 40 has a heat reflector 50, the temperature rise of the filter 44 in the module 40 is prevented even if the heated wafers 28 soon after unloaded are disposed adjacent the module 40.

In the horizontal furnace as shown in FIG. 6, down-flow clean air is caused to escape in the horizontal direction by means of the exhaust modules 70, and thus the laminated flow of clean air is not disturbed at the unloading positions A. The down-flow clean air is not always sucked in downward by means of the exhaust modules 70 but it may be exhausted by means of exhaust modules provided on the side wall 72 of the casing 6.

In the embodiment of the multi-stage type furnace as shown in FIG. 7, a clean module 40 is provided on that side wall 72 of the casing 6 which is opposed to the unloading position A in each stage. Side-flow of clean air is supplied onto the wafers 28 soon after they have been unloaded. The temperature rise of the filter 44 in each clean module 40 can be avoided due to the action of the heat reflector 50 by the same reason as explained with respect to the embodiment as shown in FIG. 6.

The filter 44 and the heat reflector 50 can be replaced by other various members having the same functions. In particular, the heat reflector 50 is not always made of metal but may be made of resin or the like so long as the plate has a heat reflecting film on its surface.

The air filter according to this invention is not only applied to a heat treatment apparatus but is suited to a plasma furnace, an ion-implanting apparatus and the like in which the temperature in the vicinity of their filter or filters is much raised.

This invention is not limited to the above-mentioned embodiments but is applicable to various modifications so long as they are not departed from the scope of this invention.

What is claimed is:

1. A vertical heat treatment apparatus comprising:
   a casing provided with a vertical heat treatment furnace;
   a having substrate supporting means for supporting said substrate, and putting said substrates in and taking said substrates out of said vertical heat treatment furnace;
   transporting means for transporting said substrates between said substrate holding means and said substrate supporting means;
   clean air supplying means having an air filter disposed opposed to said substrate supporting means, for supplying clean air sideways to said substrates supported by said substrates supporting means and the substrates held by the substrate holding means is at an unloading position; and
   duct means for conducting air in a clear room into said clear air supplying means.

2. The vertical heat treatment apparatus according to claim 1, wherein said duct means constitutes a bottom portion of said casing.

3. The vertical heat treatment according to claim 2, wherein said casing has a first wall constituting one wall of the clean room and a second wall opposing said one wall, the clean air supplying means is provided on the second wall and the duct means is extended from the clean room to the clean air supplying means.

4. The vertical heat treatment according to claim 3, wherein said first wall has an opening for communicating the clean room to the upper part of the inside of the casing, and which further includes another clean air supplying means provided between the upper part of the inside and the substrate holding means for supplying a clean air to the substrate holding means from the clean room.

5. The vertical heat treatment apparatus according to claim 1, further comprising a door hinged to said casing and containing said clean air supplying means.

6. The vertical heat treatment apparatus according to claim 1, wherein said clean air supplying means has a heat reflector provided at an air flowing-out side of said air filter and formed with air through holes.

7. The vertical heat treatment apparatus according to claim 4, wherein said heat reflector is separated from said substrate supporting means by such a distance that air flowing out of said air through holes of said heat reflector blows in a laminated state against said substrates supported by said substrate supporting means.

8. The vertical heat treatment apparatus according to claim 5, wherein said distance between said heat reflector and said substrate supporting means is 100 to 200 mm.

9. The vertical heat treatment apparatus according to claim 4, wherein a flow speed of air passing through said air through holes of said heat reflector is set to such a value that said air flowing out of said air through holes of said heat reflector blows in a laminated state against said substrates supported by said substrate supporting means.

10. The vertical heat treatment apparatus according to claim 7, wherein said flow speed of air is 0.2 to 0.4 m/sec.

11. The vertical heat treatment apparatus according to claim 1, wherein said clean air supplying means includes two plates arranged in parallel to each other and provided at an air flowing-out side of said air filter, one of said plates having through holes and the other having air through holes shifted vertically from said air through holes of said one of said plates.

12. The vertical heat treatment apparatus according to claim 11, wherein one of said plates which is disposed closer to said substrate supporting means than the other has a reflecting surface facing said substrate supporting means and hoods provided on said surface, and each surrounding each of said air through holes of said one of said plates.

13. The vertical heat treatment apparatus according to claim 1, wherein said clean air supplying means includes a heat reflecting plate formed therein with air through holes inclined with respect to a flow direction of air passing through said air filter 14. The vertical heat treatment apparatus according to claim 13, further comprising hoods provided on a surface of said heat reflecting plate which faces said substrate supporting means and each surrounding each of said air through holes.

15. A vertical heat treatment apparatus comprising:
   a casing provided with a vertical heat treatment furnace;
   substrate holding means mounted in said casing for simultaneously holding a plurality of substrates to be heat-treated in said vertical heat treatment furnace;

loading/unloading means for supporting said substrates, and for putting said substrates in and taking said substrates out of said vertical heat treatment furnace;

transporting means for transporting at least one of said substrates between said substrate holding means and said loading/unloading means;

clean air supplying means having an air filter disposed opposed to said loading/unloading means, for supplying clean air sideways to said substrates supported by said loading/unloading means and the substrates held by the substrate holding means through the air filter to prevent dust from being attached to the substrates when said loading/unloading means is at an unloading position; and duct means for conducting air in a clean room into said clean air supplying means, the duct means constituting a bottom portion of said casing and located below the substrate holding means and the transporting means.

16. A vertical heat treatment apparatus comprising:

a casing provided with a vertical heat treatment furnace;

substrate holding means mounted in said casing for simultaneously holding a plurality of substrates to be heat-treated in said vertical heat treatment furnace;

loading/unloading means having substrate supporting means for supporting said substrates, and putting said substrates in and taking said substrates out of said vertical heat treatment furnace;

transporting means for transporting said substrates between said substrate holding means and said substrate supporting means; and clean air supplying means including an air filter disposed opposed to said substrate supporting means and a heat reflector having a plurality of through-holes, located between the air filter and the substrate supporting means, for supplying clean air sideways to said substrate supported by said substrate supporting means and the substrates held by the substrate holding means through the air filter and the through-holes of the heat reflector to prevent dust from being attached to the substrates when said loading/unloading means is at an unloading position, the heat reflector reflecting heat from the substrate to prevent the heat from entering into the filter.

17. A vertical heat treatment apparatus comprising:

a casing provided with a vertical heat treatment furnace;

substrate holding means mounted in said casing for simultaneously holding a plurality of substrates to be heat-treated in said vertical heat treatment furnace;

loading/unloading means having substrate supporting means for supporting said substrates, and putting said substrates in and taking said substrates out of said vertical heat treatment furnace;

transporting means for transporting said substrates between said substrate holding means and said substrate supporting means; and clean air supplying means including an air filter disposed opposed to said loading/unloading means and a heat reflector having a plurality of through-holes, located between the air filter and the loading/unloading means, for supplying clean air sideways to said substrates supported by said substrate supporting means and the substrates held by the substrate holding means through the air filter and the through-holes of the heat reflector to prevent dust from being attached to the substrates when said loading/unloading means is at an unloading position, said substrate holding means, the loading/unloading means, the heat reflector and the filter being arranged in substantially the same level.

* * * * *

UNITED STATES PATENT AND TRADEMARK OFFICE
CERTIFICATE OF CORRECTION

PATENT NO. : 5,221,201
DATED : June 22, 1993
INVENTOR(S) : KENICHI YAMAGA ET AL

It is certified that error appears in the above-indentified patent and that said Letters Patent is hereby corrected as shown below:

In column 7, between lines 46 and 47 (Claim 1) insert the paragraph --a substrate holding means mounted in said casing for simultaneously holding a plurality of substrates to be heat-treated in said vertical heat treatment furnace--.

In column 7, line 47 (Claim 1) change "a" to --loading/unloading means--.

Also in column 7, line 58 (Claim 1) after "means" insert --through the air filter to prevent dust from being attached to the substrate when said loading/unloading means--.

UNITED STATES PATENT AND TRADEMARK OFFICE
CERTIFICATE OF CORRECTION

PATENT NO. : 5,221,201
DATED : June 22, 1993
INVENTOR(S) : KENICHI YAMAGA ET AL

It is certified that error appears in the above-indentified patent and that said Letters Patent is hereby corrected as shown below:

In column 8, line 19, change "4" to --6--;
    line 25, change "5" to --7--;
    line 29, change "4" to --6--;
    line 36, change "7" to --9--.

Signed and Sealed this

Fifth Day of April, 1994

Attest:

BRUCE LEHMAN

*Attesting Officer*     *Commissioner of Patents and Trademarks*